(12) United States Patent  (10) Patent No.: US 8,654,468 B2
Morling et al.  (45) Date of Patent: Feb. 18, 2014

(54) MULTI-RATE OVERSAMPLING OF ANALOG SIGNALS IN STORAGE DEVICES

(75) Inventors: Robert Morling, Tockington (GB); Rafel Jibry, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 74 days.

(21) Appl. No.: 13/459,762

(22) Filed: Apr. 30, 2012

(65) Prior Publication Data

US 2013/0286497 A1  Oct. 31, 2013

(51) Int. Cl.
*G11B 20/10* (2006.01)
(52) U.S. Cl.
USPC .................................................. 360/39
(58) Field of Classification Search
None
See application file for complete search history.

(56) References Cited

U.S. PATENT DOCUMENTS

| | | | |
|---|---|---|---|
| 4,630,285 A * | 12/1986 | Dyer et al. | 375/259 |
| 5,233,546 A * | 8/1993 | Witte | 708/3 |
| 5,479,168 A * | 12/1995 | Johnson et al. | 360/32 |
| 6,041,080 A | 3/2000 | Fraisse | |
| 6,525,359 B2 * | 2/2003 | Tanaka et al. | 257/295 |
| 6,707,407 B2 | 3/2004 | Troy et al. | |
| 7,199,956 B1 * | 4/2007 | Moser et al. | 360/46 |
| 7,227,489 B2 * | 6/2007 | Tryggvason et al. | 341/155 |
| 7,233,268 B1 * | 6/2007 | Lin et al. | 341/61 |
| 7,991,069 B2 | 8/2011 | Straeussnigg | |
| 2003/0052804 A1 * | 3/2003 | Barry et al. | 341/141 |
| 2005/0096879 A1 * | 5/2005 | Waite et al. | 702/189 |
| 2006/0083297 A1 | 4/2006 | Yan et al. | |

FOREIGN PATENT DOCUMENTS

EP  1067688  1/2001

* cited by examiner

*Primary Examiner* — Thang Tran
(74) *Attorney, Agent, or Firm* — Robert M. Brush

(57) ABSTRACT

Multi-rate oversampling of analog signals in storage devices is described. A method of processing an analog signal derived from a storage medium in a storage device includes: filtering the analog signal with an anti-alias filter having a fixed cut-off frequency related to a target sampling rate; sampling the analog signal using an over-sampling rate of a plurality of over-sampling rates provided by a variable-rate analog-to-digital converter (ADC) to produce an over-sampled digital signal; and filtering the over-sampled digital signal using a decimation filter of a plurality of decimation filters provided by a digital signal processor (DSP) to produce a digital signal having the target sampling rate.

12 Claims, 2 Drawing Sheets

200

MULTI-RATE OVERSAMPLING OF ANALOG SIGNALS IN STORAGE DEVICES

BACKGROUND

Magnetic storage devices are often included in computer systems to provide high-capacity secondary storage or data archival. Magnetic storage includes magnetic tape systems, hard disk drives, and the like. Magnetic storage generally comprises a recording medium (storage medium) and an access device. The access device includes a head assembly having write elements that generate magnetic fields to encode data onto the recording medium, and read elements that sense magnetic fields of the recoding medium to read data. The read elements produce analog signals, which undergo both analog and digital processing to recover the stored data.

BRIEF DESCRIPTION OF THE DRAWINGS

Some embodiments of the invention are described with respect to the following figures.

DETAILED DESCRIPTION

Multi-rate oversampling of analog signals in storage devices is described. In an embodiment, an analog signal can be derived from a storage medium in a storage device. The analog signal is filtered with an anti-alias filter having a cut-off frequency related to a target sampling rate. The filtered analog signal is then sampled by a variable-rate analog-to-digital converter (ADC). The variable-rate ADC can sample using any of a plurality of over-sampling rates. The ADC selects (or is controlled to select) one of the over-sampling rates to sample the filtered analog signal. The oversampled digital signal is then filtered by a decimator. The decimator can be implemented by a digital signal processor (DSP). The decimator can provide a plurality of decimation filters. The decimator selects (or is controlled to select) a decimation filter that produces a digital signal having the target sampling rate. This and other embodiments can be understood with reference to example implementations described herein.

The signal processing described herein can be used in magnetic tape systems, such as linear tape systems compliant with the Linear Tape Open (LTO) standard, as well as other types of storage systems that generate analog signals from storage media. When an analog signal is sampled for digital processing, an anti-alias filter can be included before the sampling device. The anti-alias filter prevents unwanted signals of frequencies outside the desired signal pass-band from appearing in the sampled signal spectrum. If the sample rate of the system is variable, then the anti-alias filter can have a variable cut-off frequency in accordance with the sampling rate. However, such an anti-alias filter with a variable cut-off frequency can be expensive in terms of component cost, circuit implementation area, and the like. In accordance with example implementations, multiple over-sampling rates are used by the sampling device to allow use of a simpler, loss costly anti-alias filter having a single cut-off frequency that can be substantially fixed. As the oversampling rate is changed (e.g., based on expected data rate), the factor by which the oversampled stream is decimated is also changed. The decimation filters can have transfer functions that are substantially similar, such that the decimated sample stream has a common power spectral density regardless of the selected oversampling rate. While example implementations may be described in terms of application to magnetic tape systems, it is to be understood that such example implementations are applicable to a wide variety of storage systems that derive analog signals from storage media.

Figure 1:
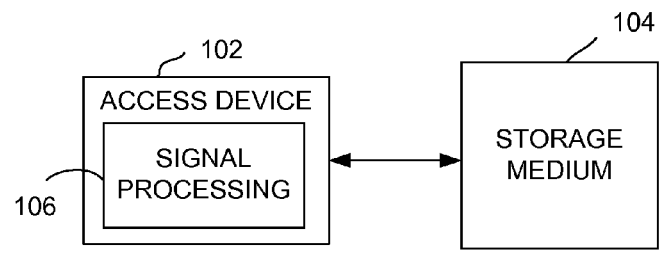
FIG. 1 is a block diagram depicting a storage system according to an example implementation.

FIG. 1 is a block diagram depicting a storage system 100 according to an example implementation. The storage system 100 includes an access device 102 and a storage medium 104. The storage medium 104 includes data stored thereon. For example, the storage medium can be magnetic tape having magnetically stored data. The access device 102 includes a signal processing circuit 106. The signal processing circuit 106 senses and processes analog signal(s) derived from the storage medium 104. The signal processing circuit 106 performs analog and digital signal processing to recover the stored data.

Figure 2:
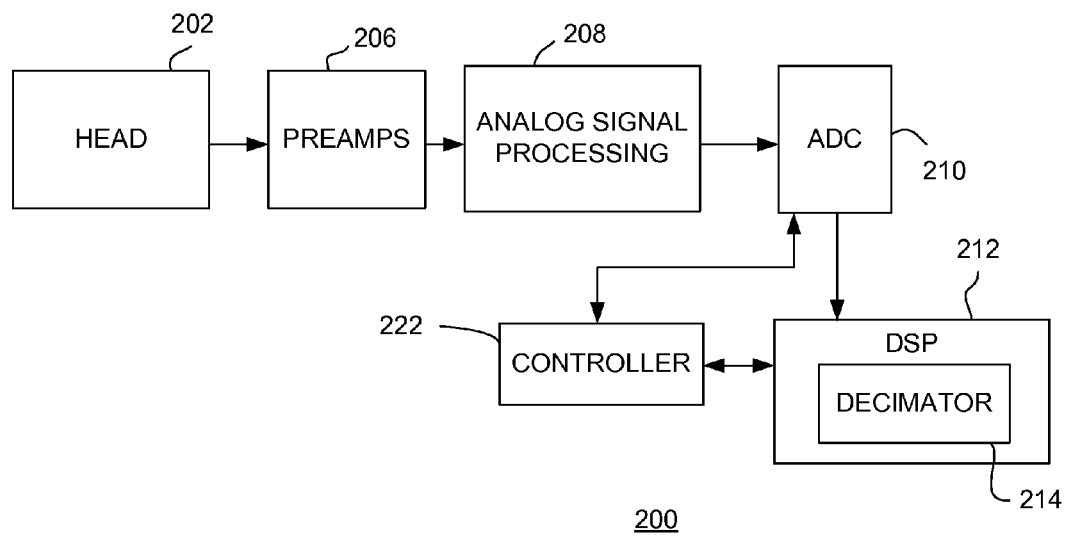
FIG. 2 is a block diagram depicting a signal processing system for a storage device according to an example implementation.

FIG. 2 is a block diagram depicting a signal processing system 200 for a storage device according to an example implementation. The signal processing system 200 includes a head 202, a preamplifier circuit ("preamps 206"), an analog signal processing circuit 208, an analog-to-digital converter (ADC) 210, a digital signal processors (DSP) 212, and a controller 222. The head 202 traverses a storage medium, such as magnetic tape. The head 202 senses magnetic patterns on the storage medium and produces an analog signal. The preamps 206 amplify the analog signal produced by the head 202. The analog signal processing circuit 208 pre-conditions the analog signal for digital conversion. As discussed below, the analog signal processing circuit 208 filters the analog signal in the analog domain to prevent unwanted frequencies outside of a desired signal pass-band from appearing in the sampled signal spectrum (e.g., anti-alias filtering).

The ADC 210 converts the analog signal into digital samples for processing in the digital domain. The ADC 210 can sample at a plurality of different sampling rates and thus is a variable-rate ADC. In an example, the ADC 210 can sample at a plurality of oversampling rates. By "oversampling" it is meant that the sampling rate is greater than that required by the Nyquist theorem (i.e., rates higher than twice the bandwidth of the analog signal being sampled). In an example, the sampling rate of the ADC 210 can be set by the controller 222. The controller 222 can set the sampling rate of the ADC 210 based on various parameters with respect to the storage media. For example, each LTO generation has a different recording density, which results in a different data rate. In an example, the controller 222 can set the sampling rate of the ADC 210 based on the expected data rate (which may depend on the storage medium, LTO generation, etc.).

The DSP 212 processes the digital samples of the analog signal in the digital domain. In particular, the DSP 212 includes a decimator 214 that decimates the oversampled digital stream to produce digital samples at a target sample rate. As discussed below, the decimator 214 can include a plurality of decimation filters corresponding to the plurality of oversampling rates of the ADC 210. In an example, the controller 222 can inform the DSP 212 of the selected oversampling rate such that the decimator 214 can select the appropriate decimation filter to achieve the target sampling rate. The DSP 212 may perform other functions in order to recover the data from the digital samples. The DSP 212 can be implemented as a processor, such as a general/special purpose digital signal processor circuit, a microcontroller, or microprocessor and associated software programming, or other circuitry adapted to perform the computations described herein or their equivalents. The DSP 212 can perform other operations, such as other filtering operations on the digital samples.

Figure 3:
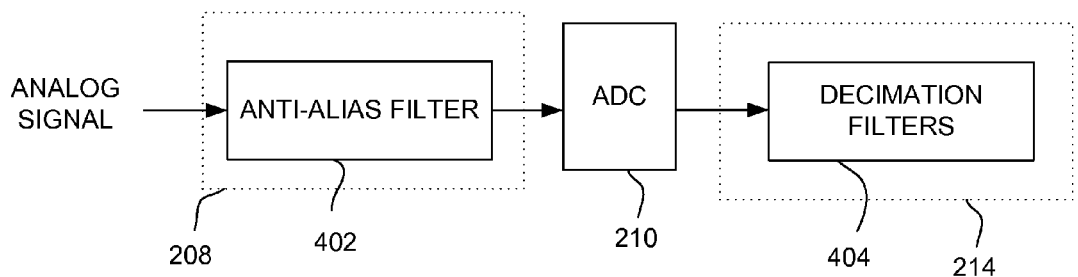
FIG. 3 is a block diagram depicting a portion of the signal processing system shown in FIG. 2 according to an example implementation.

FIG. 3 is a block diagram depicting a portion 300 of the signal processing system 200 according to an example implementation. The analog signal processing circuit 208 includes an anti-alias filter 402. The anti-alias filter 402 can include a cut-off frequency related to a target sampling rate (e.g., a cut-off frequency at least half the target sampling rate to satisfy the Nyquist theorem). The ADC 210 can select an oversampling rate from a plurality of oversampling rates, as noted above. The decimator 214 includes a plurality of decimation filters 404. The decimator 214 can select a decimation filter based on the selected oversampling rate such that digital samples are produced at the target sampling rate. In an example, each of the decimation filters includes a low pass filter. Low pass filters can be implemented by summing groups of samples of the oversampled digital signal, where a number of samples in each of the groups is related to the ratio of the oversampling rate and the target sampling rate. The plurality of decimation filters 404 can output digital signals having a common power spectral density at the target sampling rate.

Figure 4:
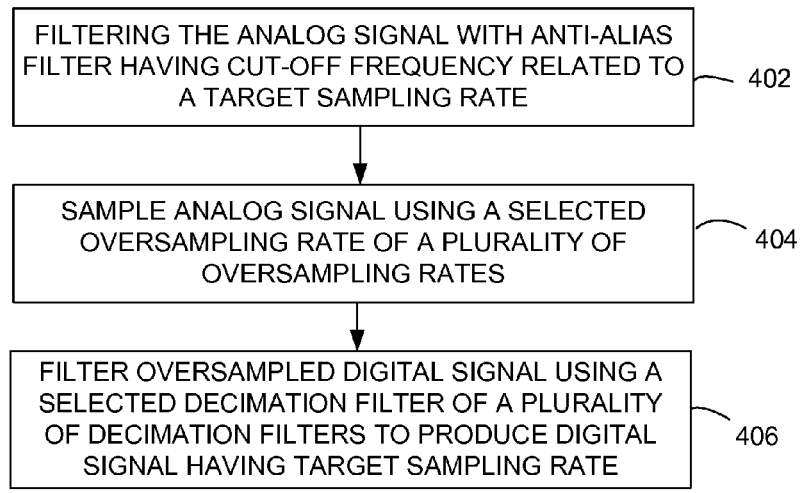
FIG. 4 is a flow diagram depicting a method of processing an analog signal derived from a storage medium of a storage device according to an example implementation.

FIG. 4 is a flow diagram depicting a method 400 of processing an analog signal derived from a storage medium of a storage device according to an example implementation. The method 400 begins at step 402, where the analog signal is filtered with an anti-alias filter having a cut-off frequency related to a target sampling rate. At step 404, the analog signal is sampled using a selected oversampling rate of a plurality of oversampling rates. At step 406, the oversampled digital signal is decimated using a selected decimation filter of a plurality of decimation filters to produce a digital signal having the target sampling rate.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method of processing an analog signal derived from a storage medium in a storage device, comprising:
filtering the analog signal with an anti-alias filter having a cut-off frequency related to a target sampling rate;
sampling the filtered analog signal using an over-sampling rate of a plurality of over-sampling rates provided by a variable-rate analog-to-digital converter (ADC) to produce an over-sampled digital signal;
filtering the over-sampled digital signal using a decimation filter of a plurality of decimation filters provided by a digital signal processor (DSP) to produce a digital signal having the target sampling rate; and
summing groups of samples of the over-sampled digital signal, where a number of samples in each of the groups is related to a ratio of the over-sampling rate and the target sampling rate.

2. The method of claim 1, further comprising:
obtaining an expected data rate;
selecting the over-sampling rate based on the expected data rate.

3. The method of claim 1, wherein the plurality of decimation filters provide digital signals having a common power spectral density.

4. The method of claim 1, wherein the step of filtering the over-sampled digital signal using the decimation filter includes:
low-pass filtering the digital signal.

5. An apparatus to process an analog signal derived from a storage medium in a storage device, comprising:
an anti-alias filter having a cut-off frequency related to a target sampling rate to filter the analog signal;
a variable-rate analog-to-digital converter (ADC), coupled to the anti-alias filter, to sample the filtered analog signal using an over-sampling rate of a plurality of over-sampling rates to produce an over-sampled digital signal; and
a decimator, coupled to the ADC, having a plurality of decimation filters, where the decimator selects a decimation filter of the plurality of decimation filters to filter the over-sampled digital signal to the target sampling rate; and
wherein each of the low-pass filters sums groups of samples of the over-sampled digital signal, where a number of samples in each of the groups is related to a ratio of the over-sampling rate and the target sampling rate.

6. The apparatus of claim 5, further comprising:
a controller coupled to the ADC and the decimator to control the ADC to select the over-sampling rate and the decimator to receive an expected data rate and to select the decimation filter based on the expected data rate.

7. The apparatus of claim 5, wherein the plurality of decimation filters provide digital signals having a common power spectral density.

8. The apparatus of claim 5, wherein the plurality of decimation filters include low-pass filters.

9. A storage device, comprising:
a head to derive an analog signal from a storage medium;
an anti-alias filter having a cut-off frequency related to a target sampling rate to filter the analog signal;
a variable-rate analog-to-digital converter (ADC), coupled to the anti-alias filter, to sample the filtered analog signal using an over-sampling rate of a plurality of over-sampling rates to produce an over-sampled digital signal; and
a digital signal processor (DSP), coupled to the ADC, having a plurality of decimation filters, where the DSP selects a decimation filter of the plurality of decimation filters to filter the over-sampled digital signal to the target sampling rate;
wherein each of the low-pass filters sums groups of samples of the over-sampled digital signal, where a number of samples in each of the groups is related to a ratio of the over-sampling rate and the target sampling rate.

10. The storage device of claim 9, further comprising:
a controller coupled to the ADC and the DSP to control the ADC to select the over-sampling rate and the DSP to select the decimation filter based on a type of the storage medium.

11. The storage device of claim 9, wherein the plurality of decimation filters provide digital signals having a common power spectral density.

12. The storage device of claim 9, wherein the plurality of decimation filters include low-pass filters.

\* \* \* \* \*